United States Patent
Suzuki et al.

(10) Patent No.: US 10,461,244 B2
(45) Date of Patent: Oct. 29, 2019

(54) LAMINATED STRUCTURE AND SPIN MODULATION ELEMENT

(71) Applicant: TDK CORPORATION, Tokyo (JP)

(72) Inventors: Eiji Suzuki, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/993,783

(22) Filed: May 31, 2018

(65) Prior Publication Data

US 2018/0351089 A1 Dec. 6, 2018

(30) Foreign Application Priority Data

May 31, 2017 (JP) ................................. 2017-108298

(51) Int. Cl.
| | | |
|---|---|---|
| *H01L 43/08* | (2006.01) | |
| *H01F 10/32* | (2006.01) | |
| *H01L 43/10* | (2006.01) | |
| *H01F 41/04* | (2006.01) | |
| *G11C 11/16* | (2006.01) | |

(52) U.S. Cl.
CPC ............. *H01L 43/08* (2013.01); *G11C 11/16* (2013.01); *H01F 10/3268* (2013.01); *H01F 41/046* (2013.01); *H01L 43/10* (2013.01)

(58) Field of Classification Search
CPC ....... H01F 41/046; H01F 10/00; G11C 11/16; H01L 43/08
See application file for complete search history.

(56) References Cited

U.S. PATENT DOCUMENTS

| 7,573,734 B2 | 8/2009 | Grino et al. |
| 8,300,454 B2 * | 10/2012 | Kramer ................. H01L 27/228 257/295 |
| 9,356,224 B2 | 5/2016 | Zeches et al. |
| 9,520,175 B2 | 12/2016 | Shibata et al. |

FOREIGN PATENT DOCUMENTS

| JP | 2016-063024 A | 4/2016 |
| JP | 2016-063062 A | 4/2016 |
| JP | 2016-111102 A | 6/2016 |

OTHER PUBLICATIONS

Lu You et al., Characterization and Manipulation of Mixed Phase Nanodomains in Highly Strained BiFeO.sub.3 Thin Fiilms, ACSNano. org, vol. 6, No. 6, 2012, pp. 5388-5394. (Year: 2012).*
R.J. Zeches et al., "A Strain_Drevien Mophotropic Phase Boundary in BiFeO.sub.3", Science, vol. 326, Nov. 13, 2009, pp. 977-980. (Year: 2009).*
Wang, Yue et al., "Epitaxial growth of BiFeO3 films on TiN under layers by sputtering deposition.", AIP Advances, vol. 7, pp. 055815-1 to 055815-6, (2017).

* cited by examiner

*Primary Examiner* — William Coleman
(74) *Attorney, Agent, or Firm* — Oliff PLC

(57) ABSTRACT

A laminated structure according to an embodiment includes: a ferromagnetic layer; and a multiferroic layer formed on one surface of the ferromagnetic layer, wherein a surface of the multiferroic layer on the ferromagnetic layer side includes a first region, a crystalline phase of which is rhombohedral, and a second region, a crystalline phase of which is tetragonal.

14 Claims, 3 Drawing Sheets

LAMINATED STRUCTURE AND SPIN MODULATION ELEMENT

BACKGROUND OF THE INVENTION

Field of the Invention

The present disclosure relates to a laminated structure and a spin modulation element.

Priority is claimed on Japanese Patent Application No. 2017-108298, filed May 31, 2017, the content of which is incorporated herein by reference.

Description of Related Art

Elements utilizing spins of magnetic materials have been used for various applications. For example, magnetoresistive effect elements such as giant magnetoresistance (GMR) elements constituted of a multilayer film of a ferromagnetic layer and a nonmagnetic layer and tunneling magnetoresistance (TMR) elements using an insulating layer (tunnel barrier layer or barrier layer) for a nonmagnetic layer are known. Magnetoresistive effect elements have been used for magnetic sensors, high frequency components, magnetic heads, magnetic recording media, nonvolatile random access memories (MRAM), and the like.

Magnetoresistive effect elements output a change in resistance value due to a difference in magnetization direction of two ferromagnetic layers. When a state in which magnetization directions of two ferromagnetic layers are parallel is set to "0" and a state in which magnetization directions of two ferromagnetic layers are anti-parallel is set to "1," the magnetoresistive effect elements can output binary data.

On the other hand, data has been required to be accumulated at a higher density along with an increase in data capacity in recent years. As one of means therefor, the development of elements capable of recording data with multiple values such as binary values or more has progressed. For example, Japanese Unexamined Patent Application, First Publication No. 2016-63024 and Japanese Unexamined Patent Application, First Publication No. 2016-63062 describe elements capable of recording data with multiple values by modulating spin polarizabilities of ferromagnetic layers using electric fields.

SUMMARY OF THE INVENTION

However, in the elements described in Japanese Unexamined Patent Application, First Publication No. 2016-63024 and Japanese Unexamined Patent Application, First Publication No. 2016-63062, there are a case in which a sufficient electric field cannot be generated by dielectric polarization and a case in which the anisotropy of the magnetization of a ferromagnetic layer is not sufficient, and there is a case in which data cannot be stably recorded with multiple values.

The present invention was made in view of the above-described circumstances, and an object thereof is to provide a laminated structure and a spin modulation element which are capable of stably modulating spin polarizability of a ferromagnetic material by an electric field.

In order to achieve the object, the present disclosure is directed to the following aspects.

(1) A laminated structure according to a first aspect includes: a ferromagnetic layer; and a multiferroic layer formed on one surface of the ferromagnetic layer, wherein a surface of the multiferroic layer on the ferromagnetic layer side has a first region, a crystalline phase of which is rhombohedral, and a second region, a crystalline phase of which is tetragonal.

(2) In the laminated structure according to the aspect, the surface of the multiferroic layer on the ferromagnetic layer side may have a third region, a crystalline phase of which is neither tetragonal nor rhombohedral.

(3) In the laminated structure according to the aspect, a proportion of the first region occupying the surface may be 30% or more and 70% or less.

(4) In the laminated structure according to the aspect, a proportion of the second region occupying the surface may be 30% or more and 70% or less.

(5) In the laminated structure according to the aspect, a proportion of the third region occupying the surface may be 0% or more and 30% or less.

(6) In the laminated structure according to the aspect, a plurality of first regions may be provided on the surface.

(7) In the laminated structure according to the aspect, a plurality of second regions may be provided on the surface.

(8) In the laminated structure according to the aspect, the multiferroic layer may include any one selected from a group consisting of $BiFeO_3$, $BiMnO_3$, $GaFeO_3$, $AlFeO_3$, $(Ga, Al)FeO_3$, $YMnO_3$, $CuFeO_2$, $Cr_2O_3$, $Ni_3Bi_7O_{13}I$, $LiMnPO_4$, $Y_3Fe_5O_{12}$, $TbPO_4$, and $LiCoPO_4$.

(9) In the laminated structure according to the aspect, the ferromagnetic layer may be a half metal.

(10) In the laminated structure according to the aspect, the ferromagnetic layer may include a Heusler alloy represented by a composition expression of $X_2YZ$, X in the composition expression may be a transition metal element or a noble metal element from the Co, Fe, Ni, or Cu group in the periodic table, Y may be a transition metal from the Mn, V, Cr, or Ti group or the element types for X, and Z may be a typical element from Group III to Group V.

(11) A spin modulation element according to a second aspect includes: the laminated structure according to any one of the above aspects; and a nonmagnetic layer and a second ferromagnetic layer sequentially laminated above the ferromagnetic layer of the laminated structure.

The laminated structure and the spin modulation element according to the above aspects can stably modulate spin polarizability of a ferromagnetic material by an electric field.

DETAILED DESCRIPTION OF THE INVENTION

Figure 1:
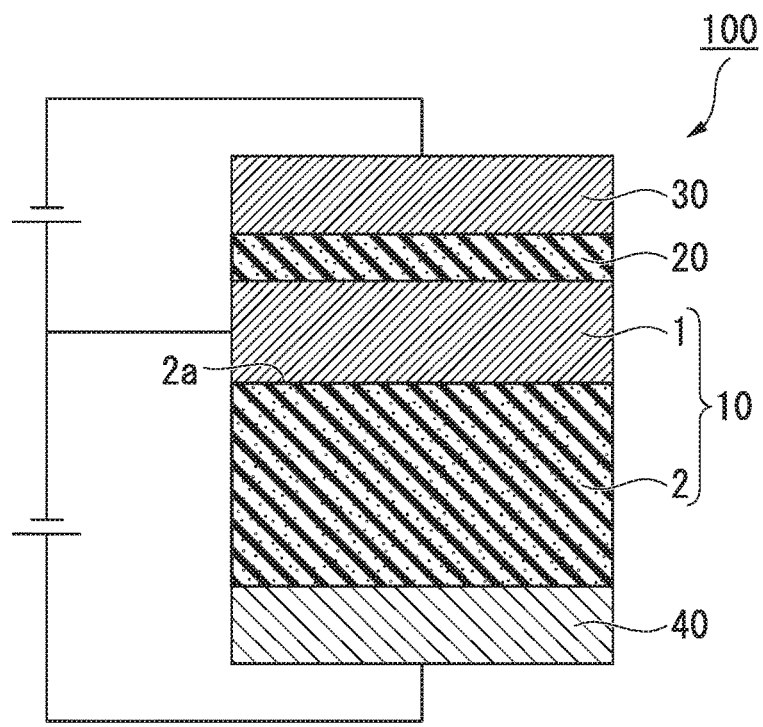
FIG. 1 is a diagram schematically showing a spin modulation element according to an embodiment.

A constitution in an embodiment will be described below with reference to the drawings. In the drawings used in the following description, enlarged characteristic parts are illustrated for convenience for the sake of easier understanding of features in some cases and dimensional proportions or the like of each component element are not necessarily the same as the actual proportions. Furthermore, materials, dimensions, and the like illustrated in the following description are merely examples and the present invention is not limited thereto.

(Spin Modulation Element)

FIG. 1 is a diagram schematically showing a spin modulation element according to an embodiment. A spin modulation element 100 illustrated in FIG. 1 includes a laminated structure 10, a nonmagnetic layer 20, and a second ferromagnetic layer 30.

Also, an electrode 40 may be laid on a surface of a second ferromagnetic layer 30 opposite to the nonmagnetic layer 20 or on a surface of a multiferroic layer 2 opposite to the ferromagnetic layer 1.

"Laminated Structure"

The laminated structure 10 includes a ferromagnetic layer 1 and a multiferroic layer 2. Although the laminated structure 10 is illustrated in FIG. 1 as a part of a constitution of the spin modulation element 100, the laminated structure 10 only can also be used as an anisotropic magnetoresistive (AMR) (magnetic anisotropy) sensor or the like.

The ferromagnetic layer 1 includes a magnetic material in which magnetization is oriented in one direction. It is desirable to use a material with strong magnetic anisotropy as a magnetic material constituting the ferromagnetic layer 1. For example, a metal selected from the group consisting of Cr, Mn, Co, Fe, and Ni and an alloy which includes one or more of these metals and has ferromagnetism can be used. Furthermore, an alloy containing one or more of these metals and at least one element of B, C, and N can also be used. To be specific, Fe, Co—Fe, and the like may be exemplified.

Also, the ferromagnetic layer 1 is preferably a half metal. A half metal is a material in which one of electron spins has a metallic band structure and the other of the electron spins has an insulator-like band structure. A half metal ideally has a large spin polarizability close to 1 on a Fermi surface.

Heusler alloys, magnetite ($Fe_3O_4$), perovskite type Mn oxides, and the like are known as half metals, but Heusler alloys are particularly desirable. Heusler alloys have features such as high lattice matching with Group III-V semiconductors, a Curie temperature equal to or higher than room temperature, and a large band gap near a Fermi surface and can have high spin polarizability even at room temperature.

Heusler alloys contain an intermetallic compound having a chemical composition of $X_2YZ$, X is a transition metal element or a noble metal element from the Co, Fe, Ni, or Cu group in the periodic table, Y is a transition metal from the Mn, V, Cr, or Ti group and can also be the types of element for X, and Z is a typical element of Group III to Group V. $Co_2FeSi$, $Co_2MnSi$, $Co_2Mn_{1-a}Fe_aAl_bSi_{1-b}$, and the like may be exemplified.

The multiferroic layer 2 is formed on one surface of the ferromagnetic layer 1. The multiferroic layer 2 contains a multiferroic material which has properties of a magnetic order and a ferroelectric order together. As a multiferroic material, any one selected from the group consisting of $BiFeO_3$, $BiMnO_3$, $GaFeO_3$, $AlFeO_3$, $(Ga, Al)FeO_3$, $YMnO_3$, $CuFeO_2$, $Cr_2O_3$, $Ni_3Bi_7O_{13}I$, $LiMnPO_4$, $Y_3Fe_5O_{12}$, $TbPO_4$, and $LiCoPO_4$ can be used. Furthermore, a material obtained by substituting some elements of the above-described materials with another element within an extent that characteristics thereof are not lost can be used as a multiferroic material. For example, a part of X in a material represented as $XYO_3$ may be substituted with another trivalent element or a part of Y may be substituted with another element serving as a 3d transition metal. Furthermore, there may be oxygen deficiency or the like occurring in a multiferroic material. Among these materials, $BiFeO_3$ is particularly desirable because a Curie temperature and a Néel temperature of $BiFeO_3$ are high and $BiFeO_3$ exhibits ferroelectric characteristics and ferromagnetism characteristics in a wide temperature range.

Characteristics of a multiferroic material differ depending on its crystal structure. When the crystal structure is rhombohedral, the multiferroic material exhibits both ferroelectric characteristics and ferromagnetism characteristics and particularly has excellent ferromagnetism characteristics. On the other hand, when the crystal structure is tetragonal, the multiferroic material has excellent ferroelectric characteristics, but ferromagnetism characteristics are exhibited to a lesser extent.

The multiferroic layer 2 has at least two effects on the ferromagnetic layer 1. A first effect is derived from ferromagnetism characteristics of the multiferroic layer 2 and a second effect is derived from ferroelectric characteristics of the multiferroic layer 2.

When the multiferroic layer 2 exhibits ferromagnetism characteristics, a magnetization direction of the ferromagnetic layer 1 is strongly oriented in one direction under an effect of the magnetization of the multiferroic layer 2 (the first effect). In other words, the multiferroic layer 2 has an effect of pinning the magnetization of the ferromagnetic layer 1 due to its ferromagnetism characteristics. When the magnetization of the ferromagnetic layer 1 is strongly fixed in one direction, magnetoresistive effects expressed between the ferromagnetic layer 1 and the facing second ferromagnetic layer 30 are increased and a rate of change in resistance value (magnetoresistive (MR) ratio) due to magnetoresistive effects is increased.

On the other hand, when the multiferroic layer 2 exhibits ferroelectric characteristics, the multiferroic layer 2 is dielectrically polarized. Charges generated by dielectric polarization induce charges at an interface in the ferromagnetic layer 1 on the multiferroic layer 2 side, and an electric field due to the interface charges changes a band structure of the ferromagnetic layer 1, and modulates spin polarizability of the ferromagnetic layer 1 (the second effect). When the spin polarizability is modulated, multi-valuing of the spin modulation element 100 can be realized. For example, this is because resistance values between the ferromagnetic layer 1 and the second ferromagnetic layer 30 are different when spin polarizability of the ferromagnetic layer 1 is 1.0 and the ferromagnetic layer 1 is parallel to the second ferromagnetic layer 30 and when spin polarizability of the ferromagnetic layer 1 is 0.5 and the ferromagnetic layer 1 is parallel to the second ferromagnetic layer 30.

Regarding the effects of the multiferroic layer 2 on the ferromagnetic layer 1, both of the first effect and the second effect are important. When a crystal structure is rhombohedral, since ferromagnetism characteristics are excellent, the first effect can be exerted on the ferromagnetic layer 1 to a great extent. On the other hand, since ferroelectric characteristics are excellent when a crystal structure is tetragonal, the second effect can be greatly exerted on the ferromagnetic layer 1.

Figure 2:
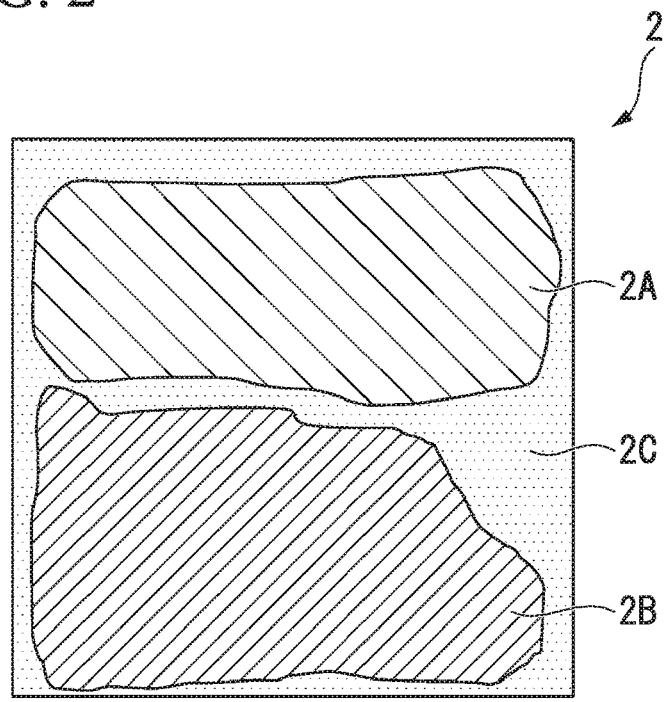
FIG. 2 is a plan view of a surface of a multiferroic layer on a ferromagnetic layer side according to the embodiment.

FIG. 2 is a plan view of a surface 2a of a multiferroic layer 2 on the ferromagnetic layer 1 side according to the embodiment. As illustrated in FIG. 2, the surface 2a of the multiferroic layer 2 on the ferromagnetic layer 1 side according to the embodiment includes a first region 2A, a crystalline phase of which is rhombohedral, and a second region 2B, a crystalline phase of which is tetragonal. Here, a tetragonal crystal is not limited to a structure in which a c axis is 90° with respect to an a axis and is allowed to include a structure in which a c axis is 90°±10° with respect to an a axis.

When the first region 2A and the second region 2B are formed on the surface 2a of the multiferroic layer 2, the first effect and the second effect can be effectively exerted on the ferromagnetic layer 1.

The first effect is caused by exchange interaction between the magnetization of the multiferroic layer 2 and the magnetization of the ferromagnetic layer 1. For this reason, the first effect is effectively exerted on the ferromagnetic layer 1 by providing the first region 2A on the surface 2a of the multiferroic layer 2 in which exchange interaction strongly acts.

Also, the second effect is caused by dielectric polarization of the multiferroic layer 2. Charge due to dielectric polarization is generated on a surface of a material. For this reason, the second effect is effectively exerted on the ferromagnetic layer 1 by providing the second region 2B on the surface 2a of the multiferroic layer 2.

The surface 2a may include a third region 2C, a crystalline phase of which is neither tetragonal nor rhombohedral. The third region 2C includes, for example, a region whose crystal structure transitions between a tetragonal crystal and a rhombohedral crystal, an amorphous region, a region whose crystal structure is disordered, a hetero-phase, and the like. When there is the third region 2C on the surface 2a of the multiferroic layer 2, a difference in lattice constant between the ferromagnetic layer 1 and the multiferroic layer 2 is relaxed due to the third region 2C so that lattice matching between the ferromagnetic layer 1 and the multiferroic layer 2 is enhanced. The third region 2C preferably occupies an area of 0% or more and 30% or less of the surface 2a.

When it is desired to increase a difference between a maximum resistance value and a minimum resistance value indicated by the spin modulation element 100, it is desirable to set a proportion of the first region 2A occupying the surface 2a of the multiferroic layer 2 to 30% or more and 70% or less.

When the proportion of the first region 2A increases, the first effect increases and the magnetization of the ferromagnetic layer 1 is firmly fixed. For this reason, magnetoresistive effects expressed between the ferromagnetic layer 1 and the second ferromagnetic layer 30 increase and thus a rate of change in resistance value (MR ratio) due to the magnetoresistive effects increases. On the other hand, when the proportion of the first region 2A becomes too large, the second effect decreases and an amount of change in spin polarizability decreases.

On the other hand, when it is desired to make each of multiple values indicated by the spin modulation element 100 distinct, it is desirable to set a proportion of the second region 2B occupying the surface 2a of the multiferroic layer 2 to 30% or more and 70% or less.

When the proportion of the second region 2B increases, the second effect increases and an amount of change in spin polarizability of the ferromagnetic layer 1 increases. When an amount of change in spin polarizability increases even when the magnetization of the ferromagnetic layer 1 and the magnetization of the second ferromagnetic layer 30 have the same parallel state, resistance values between the ferromagnetic layer 1 and the second ferromagnetic layer 30 are greatly different. In other words, amounts of change in resistance between the two states increase even when the two states have the same parallel state and thus output data can be clearly multivalued. On the other hand, when the proportion of the second region 2B becomes too large, the first effect decreases and a rate of change in resistance value (MR ratio) due to the magnetoresistive effects decreases.

Here, an area proportion of each region is obtained as follows. First, a roughness of the interface between the ferromagnetic layer 1 and the multiferroic layer 2 is obtained and Min in Max/Min is used as a reference. Evaluation is performed using a surface which is at a depth within 3 nm inside the multiferroic layer 2 from the reference surface as a measurement surface. Moreover, an area proportion of each region is comprehensively obtained by distribution evaluation of a polarization state found by surface scanning using piezoresponse force microscopy (PFM), evaluation regarding a lattice state using X-ray diffraction (XRD), transmission electron microscopy (TEM) in a film surface direction, or the like.

Figure 3:
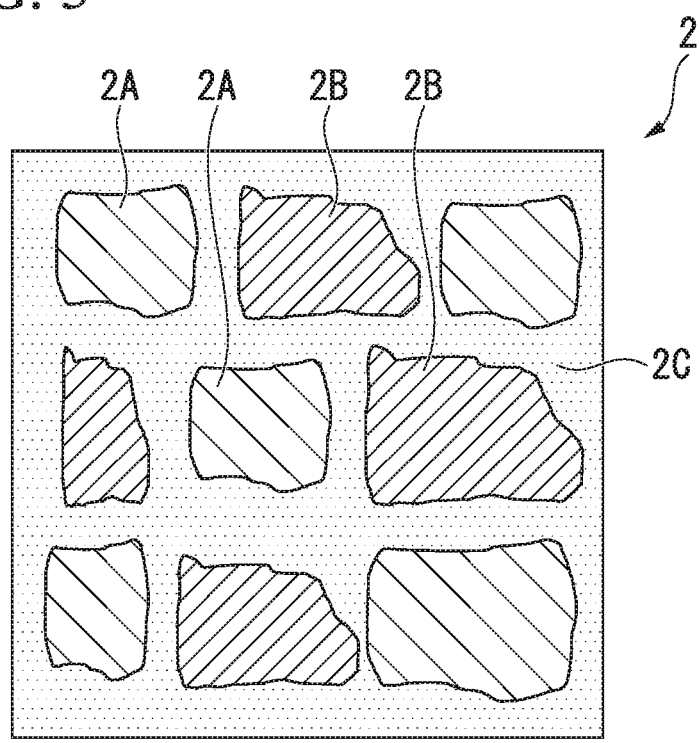
FIG. 3 is a plan view of a surface of a multiferroic layer on a ferromagnetic layer side according to another example of the embodiment.

In FIG. 2, one first region 2A and one second region 2B are provided on the surface 2a of the multiferroic layer 2, but a plurality of first regions 2A and a plurality of second regions 2B may be provided as illustrated in FIG. 3. FIG. 3 is a plan view of a surface 2a of a multiferroic layer 2 on a ferromagnetic layer 1 side according to another example of the embodiment.

When a plurality of first regions 2A and a plurality of second regions 2B are provided, localization of a portion of the ferromagnetic layer 1 on which the first effect is strongly exerted and a portion of the ferromagnetic layer 1 on which the second effect is strongly exerted can be prevented. In other words, the first effect and the second effect can be uniformly exerted on the entire ferromagnetic layer 1.

A layer thickness of the multiferroic layer 2 is preferably 5 nm or more and 800 nm or less, more preferably 10 nm or more and 700 nm or less, and even more preferably 20 nm or more and 600 nm or less. When the layer thickness of the multiferroic layer 2 becomes too thick, an amount of charge induced on the surface 2a of the multiferroic layer 2 decreases. On the other hand, when the layer thickness of the multiferroic layer 2 is too thin, the multiferroic layer 2 does not express sufficient ferromagnetism characteristics and ferroelectric characteristics in some cases.

"Nonmagnetic Layer"

The nonmagnetic layer 20 may be an insulator, a semiconductor, or a metal. When the nonmagnetic layer 20 is made of an insulator, a laminate constituted of the ferromagnetic layer 1, the nonmagnetic layer 20, and the second ferromagnetic layer 30 is set as a tunneling magnetoresistance (TMR) element. In addition, when the nonmagnetic layer 20 is made of a semiconductor or a metal, a laminate constituted of the ferromagnetic layer 1, the nonmagnetic layer 20, and the second ferromagnetic layer 30 is set as a giant magnetoresistance (GMR) element.

Known materials can be used for the nonmagnetic layer 20.

For example, when the nonmagnetic layer 20 is made of an insulator or a semiconductor, hexagonal-BN, graphene, $HfO_2$, $Y_2O_3$, TaO, GaO, TiO, InO, BaO, $CaF_2$, $Al_2O_3$, $SiO_2$, MgO, $MgAl_2O_4$, or the like can be used as its material. Among these, since MgO and $MgAl_2O_4$ are materials by which coherent tunneling can be realized, an MR ratio can be increased. Furthermore, materials obtained by substituting a part or all of Mg and Al of MgO and $MgAl_2O_4$ with Zn, Cd, Ag, Pt, Pb, Ga, In, Ge, or the like can also be used for the nonmagnetic layer 20.

Also, when the nonmagnetic layer 20 is made of a metal, Cu, Au, Ag, or the like can be used as its material.

"Second Ferromagnetic Layer"

The second ferromagnetic layer 30 forms a magnetoresistive effect element together with the ferromagnetic layer 1 and the nonmagnetic layer 20. When the ferromagnetic layer 1 is a fixed layer, the second ferromagnetic layer 30 is a free layer. In addition, when the ferromagnetic layer 1 is a free layer, the second ferromagnetic layer 30 is a fixed layer.

Known materials can be used as a material of the second ferromagnetic layer 30. For example, a metal selected from the group consisting of Cr, Mn, Co, Fe, and Ni and an alloy which includes one or more of these metals and has ferromagnetism can be used. Furthermore, an alloy containing one or more of these metals and at least one element of B, C, and N can also be used. To be specific, Co—Fe and Co—Fe—B may be exemplified. In order to obtain a higher output, a Heusler alloy may be used for the second ferromagnetic layer 30.

(Method for Manufacturing Spin Modulation Element)

A method for manufacturing the spin modulation element 100 will be described. First, a base material is prepared. It is desirable to use a material having conductivity as the base material such that a voltage is applied in a lamination direction of the laminated structure 10. When the base material has conductivity, the base material can also serve as an electrode.

Subsequently, the multiferroic layer 2 is laminated above the prepared base material. Examples of a laminating method include a sputtering method, a chemical vapor deposition (CVD) method, a molecular beam epitaxial (MBE) method, and the like.

A crystalline phase of the multiferroic layer 2 is adjusted using a difference in crystalline state between a substrate above which the multiferroic layer 2 is laminated and the multiferroic layer 2. A case in which the multiferroic layer 2 is made of $BiFeO_3$ will be described in detail as an example. First, a (001) $LaAlO_3$ substrate having a smaller lattice constant than that of a rhombohedral crystal phase of $BiFeO_3$ is prepared. A substrate temperature is set to 700° C. and a film of $BiFeO_3$ is formed above the (001) $LaAlO_3$ substrate with a layer thickness of 250 nm.

A crystalline phase of $BiFeO_3$ at an initial film formation stage thereof is a tetragonal crystal phase because $BiFeO_3$ undergoes compressive stress from the (001) $LaAlO_3$ substrate. On the other hand, when a formed film thickness of $BiFeO_3$ increases, a crystalline phase gradually relaxes to a normally stable rhombohedral crystal phase. For this reason, when film formation is stopped at a time when a formed film thickness of the entire surface reaches a formed film thickness of about 250 nm before the crystalline phase thereof relaxes to a rhombohedral crystal phase, a surface which includes both of the tetragonal crystal phase and the rhombohedral crystal phase can be formed. In other words, the first region 2A and the second region 2B are formed on the surface 2a of the multiferroic layer 2.

Subsequently, the ferromagnetic layer 1, the nonmagnetic layer 20, and the second ferromagnetic layer 30 are sequentially laminated above the multiferroic layer 2. These layers can be laminated in the same manner as a ferromagnetic layer and a nonmagnetic layer of a magnetoresistive effect element such as a GMR element and a TMR element. For example, a sputtering method, an evaporation method, a laser ablation method, an MBE method, or the like can be used. Furthermore, it is desirable to laminate an electrode on a surface of the second ferromagnetic layer 30 opposite to the nonmagnetic layer 20. When the electrode is provided, a current can flow uniformly over the entire surface of the ferromagnetic layer 1.

(Operation of Spin Modulation Element)

Next, an operation of a spin modulation element will be described and how multivaluing is realized will be described.

FIGS. 4A to 4D are schematic diagrams for explaining an operation of the spin modulation element 100. The spin modulation element 100 includes a switch SW1 configured to control a current through the second ferromagnetic layer 30 and the ferromagnetic layer 1 and a switch SW2 configured to apply an electric field to the multiferroic layer 2 connected thereto.

Figure 4A:
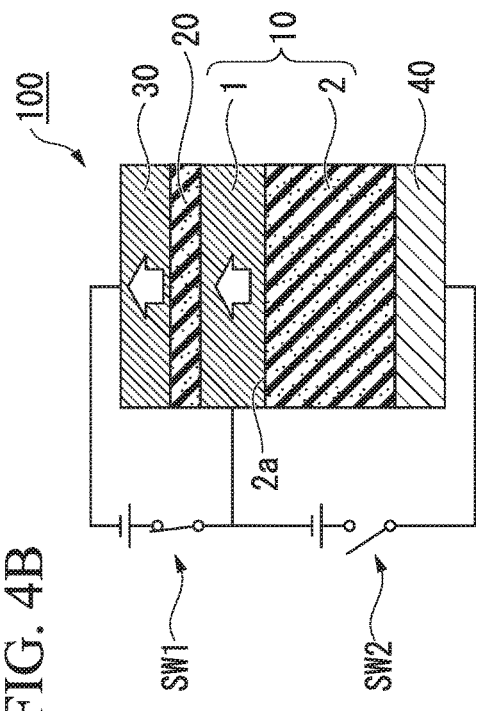
FIG. 4A is a schematic diagram for explaining an operation of a spin modulation element.
Figure 4B:
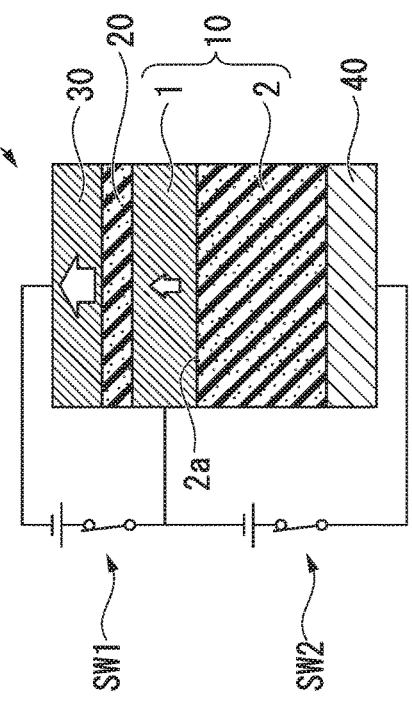
FIG. 4B is a schematic diagram for explaining an operation of a spin modulation element.

First, as illustrated in FIGS. 4A and 4B, when the switch SW2 is opened, an electric field is not applied to the multiferroic layer 2. For this reason, the spin modulation element 100 has two states, i.e., a first state in which magnetization directions of the second ferromagnetic layer 30 and the ferromagnetic layer 1 are anti-parallel (FIG. 4A) and a second state in which magnetization directions of the second ferromagnetic layer 30 and the ferromagnetic layer 1 are parallel (FIG. 4B). A spin polarized current flows in a lamination direction of a laminate due to closing the switch SW1 and the magnetization direction of the ferromagnetic layer 1 is inverted by a spin transfer torque (STT).

Figure 4C:
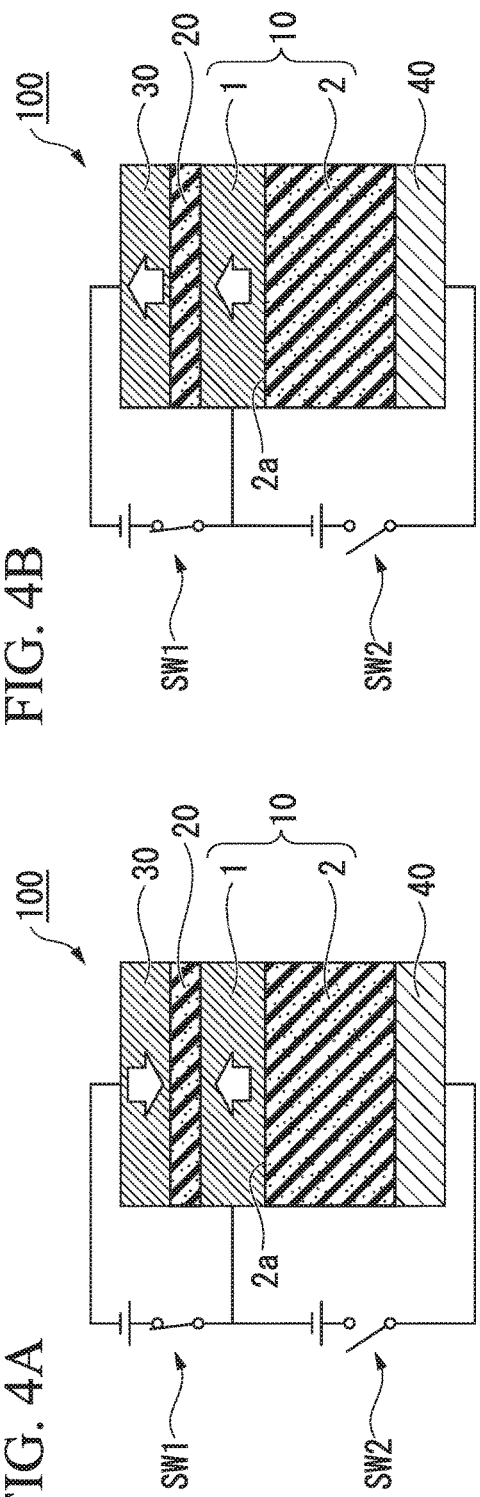
FIG. 4C is a schematic diagram for explaining an operation of a spin modulation element.
Figure 4D:
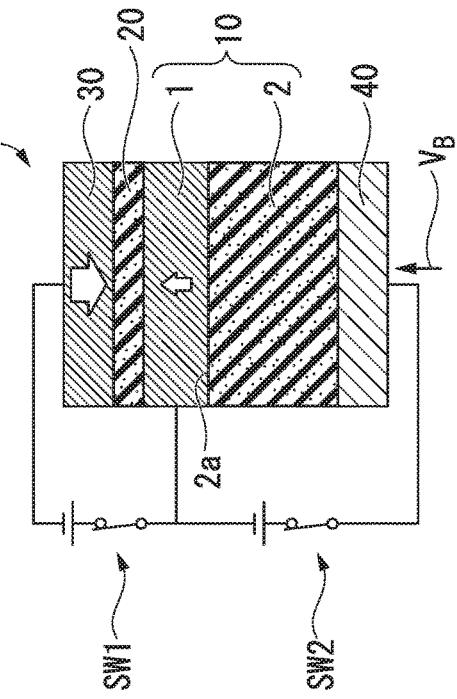
FIG. 4D is a schematic diagram for explaining an operation of a spin modulation element.

Subsequently, as illustrated in FIGS. 4C and 4D, the switch SW2 is closed and an electric field is applied between the ferromagnetic layer 1 and the electrode 40 (to the multiferroic layer 2). When an electric field is applied to the multiferroic layer 2, the multiferroic layer 2 inverts a direction of dielectric polarization. An electric field generated by the dielectric polarization changes a band structure of the ferromagnetic layer 1 and modulates spin polarizability of the ferromagnetic layer 1.

For example, when a positive voltage is applied to the multiferroic layer 2 (in a voltage $V_B$ direction in FIG. 4C), band bending is induced in a down-spin band structure of the ferromagnetic layer 1 by an electric field. For this reason, a small number of spin carriers are induced at an interface of the ferromagnetic layer 1 on the multiferroic layer 2 side and spin polarizability of the ferromagnetic layer 1 is decreased. In FIGS. 4C and 4D, a decrease in spin polarizability is schematically illustrated using a size of an arrow.

As illustrated in FIGS. 4C and 4D, two states, i.e., a third state in which magnetization directions of the second ferromagnetic layer 30 and the ferromagnetic layer 1 are anti-parallel (FIG. 4C) and a fourth state in which magnetization directions of the second ferromagnetic layer 30 and the ferromagnetic layer 1 are parallel (FIG. 4D) are provided even in a state in which spin polarizability of the ferromagnetic layer 1 is decreased.

In other words, in the spin modulation element 100 four states are caused by controlling the switch SW1 and the switch SW2. In the four states, resistance values thereof increase in order of a first state, a third state, a fourth state, and a second state.

Since the magnetization of the ferromagnetic layer 1 is firmly fixed when the surface 2a of the multiferroic layer 2 has the first region 2A, a difference in resistance value between the first state and the second state increases. Furthermore, when the surface 2a of the multiferroic layer 2 has the second region 2B, a change in spin polarizability due to dielectric polarization increases and differences in resistance value between the first state and the third state and between the second state and the fourth state increase.

Since the surface 2a of the multiferroic layer 2 has the first region 2A, a crystalline phase of which is rhombohedral and the second region 2B, a crystalline phase of which is tetragonal in the spin modulation element 100 according to the embodiment as described above, differences in resistance value between the four states can be increased and stable multiple value recording can be performed.

Although the embodiments of the present disclosure have been described above with reference to the drawings, each constitution in each embodiment, a combination thereof, and the like are merely examples and additions, omissions, substitutions, and other modifications of the constitution are possible without departing from the scope of the present invention.

EXPLANATION OF REFERENCES

1: Ferromagnetic layer
2: Multiferroic layer
2a: Surface
2A: First region
2B: Second region
2C: Third region
10: Laminated structure
20: Nonmagnetic layer
30: Second ferromagnetic layer
40: Electrode
100: Spin modulation element
SW1, SW2: Switch

What is claimed is:

1. A laminated structure, comprising:
a ferromagnetic layer; and
a multiferroic layer formed on one surface of the ferromagnetic layer,
wherein a surface of the multiferroic layer on the ferromagnetic layer side includes a first region, a crystalline phase of which is rhombohedral, and a second region, a crystalline phase of which is tetragonal,
a proportion of the first region occupying the surface is 30% or more and 70% or less, and
a proportion of the second region occupying the surface is 30% or more and 70% or less.

2. The laminated structure according to claim 1, wherein the surface of the multiferroic layer on the ferromagnetic layer side has a third region, a crystalline phase of which is neither tetragonal nor rhombohedral.

3. The laminated structure according to claim 1, wherein a plurality of first regions are provided on the surface.

4. The laminated structure according to claim 1, wherein a plurality of second regions are provided on the surface.

5. The laminated structure according to claim 1, wherein the multiferroic layer includes any one selected from a group consisting of $BiFeO_3$, $BiMnO_3$, $GaFeO_3$, $AlFeO_3$, $(Ga,Al)FeO_3$, $YMnO_3$, $CuFeO_2$, $Cr_2O_3$, $Ni_3Bi_7O_{13}I$, $LiMnPO_4$, $Y_3Fe_5O_{12}$, $TbPO_4$, and $LiCoPO_4$.

6. The laminated structure according to claim 1, wherein the ferromagnetic layer is a half metal.

7. The laminated structure according to claim 1, wherein the ferromagnetic layer includes a Heusler alloy represented by a composition expression of $X_2YZ$, X in the composition expression is a transition metal element or a noble metal element from the Co, Fe, Ni, or Cu group in the periodic table, Y is a transition metal from the Mn, V, Cr, or Ti group or the types of element for X, and Z is a typical element from Group III to Group V.

8. A spin modulation element, comprising:
the laminated structure according to claim 1; and
a nonmagnetic layer and a second ferromagnetic layer sequentially laminated above the ferromagnetic layer of the laminated structure.

9. The laminated structure according to claim 2, wherein a proportion of the third region occupying the surface is 0% or more and 30% or less.

10. The laminated structure according to claim 2, wherein a plurality of second regions are provided on the surface.

11. The laminated structure according to claim 2, wherein a plurality of first regions are provided on the surface.

12. The laminated structure according to claim 9, wherein a plurality of first regions are provided on the surface.

13. The laminated structure according to claim 9, wherein a plurality of second regions are provided on the surface.

14. The laminated structure according to claim 3, wherein a plurality of second regions are provided on the surface.

* * * * *